(12) United States Patent
Cyue et al.

(10) Patent No.: US 12,738,904 B2
(45) Date of Patent: Sep. 15, 2026

(54) LOW-EMI CAPACITIVELY-COUPLED CLASS-D AMPLIFIERS WITH VOLTAGE BOOSTING

(71) Applicant: National Cheng Kung University, Tainan (TW)

(72) Inventors: Jhuang-Wei Cyue, Tainan (TW); Tai-Haur Kuo, Tainan (TW)

(73) Assignee: National Cheng Kung University, Tainan (TW)

( * ) Notice: Subject to any disclaimer, the term of this patent is extended or adjusted under 35 U.S.C. 154(b) by 316 days.

(21) Appl. No.: 18/754,933

(22) Filed: Jun. 26, 2024

(65) Prior Publication Data

US 2026/0005657 A1 Jan. 1, 2026

(51) Int. Cl.
*H03F 3/217* (2006.01)

(52) U.S. Cl.
CPC ....... *H03F 3/2173* (2013.01); *H03F 2200/03* (2013.01); *H03F 2200/114* (2013.01); *H03F 2200/271* (2013.01); *H03F 2200/351* (2013.01)

(58) Field of Classification Search
CPC ...... H03F 3/217; H03F 3/2173; H03F 3/2178; H03F 3/38
See application file for complete search history.

(56) References Cited

U.S. PATENT DOCUMENTS 8,643,436 B2 * 2/2014 Ni .......................... H03F 3/217
330/251
2022/0247312 A1 * 8/2022 Ihs ........................ H02M 3/157
2026/0121583 A1 * 4/2026 Dubey .................. H03F 1/0205

* cited by examiner

*Primary Examiner* — Henry Choe
(74) *Attorney, Agent, or Firm* — Demian K. Jackson; Jackson IPG PLLC

(57) ABSTRACT

The present invention is a Class-D amplifier including: a capacitively-coupled amplifier, configured to receive an input signal and a feedback signal and generate an error signal; and a loop filter, coupled to input capacitor and the feedback capacitor, configured to generate a processed signal according to the error signal; and a pulse-width modulation (PWM) generator, coupled to the loop filter, configured to generate a plurality of PWM signals according to the processed signal and a control signal; and a voltage boosting power stage, coupled to the PWM generator, configured to generate a boosted output signal according to the plurality of PWM signals, the control signal and a power supply, and to feedback the boosted output signal to the loop filter, wherein the maximum voltage of the boosted output signal is greater than the voltage of the power supply.

14 Claims, 9 Drawing Sheets

| | Present invention | Typical Class-D amplifiers |
|---|---|---|
| To extend maximum output power | Voltage boosting power stage (1L + 2C) | Boost converter (1L + 1C) |
| To alleviate EMI issue | | H-bridge power stage with output LC filters (2L + 2C) |
| Total LC components | 1L+2C | 3L+3C |

FIG. 9

LOW-EMI CAPACITIVELY-COUPLED CLASS-D AMPLIFIERS WITH VOLTAGE BOOSTING

TECHNICAL FIELD OF THE INVENTION

The present invention relates to a Class-D amplifier. More particularly, the present invention relates to a closed-loop Class-D amplifier with capacitive feedback and voltage boosting power stage which is able to provide low total harmonic distortion (THD), high signal-to-noise ratio (SNR), high output power and low electromagnetic interference (EMI).

DESCRIPTION OF THE RELATED ARTS

Class-D amplifiers are widely used for battery-powered and portable devices due to their high-power-efficiency. To meet the requirements of high-end entertainment, the Class-D amplifiers should also feature low THD, high SNR and high output power. Moreover, the EMI caused by the rapid switching activities at the output of Class-D amplifiers may limit the integration with other systems. Hence, the low EMI feature is also required.

FIG. 1 is a block diagram of a closed-loop Class-D amplifier with resistive feedback according to the prior art. The closed-loop Class-D amplifier with resistive feedback includes an input resistor 11, a feedback resistor 12, a loop filter 13, a pulse-width modulation (PWM) generator 14, a power stage 15, a boost converter 16, an LC filter 17, and a speaker load 18. The closed-loop class-D amplifiers with resistive feedback are commonly adopted to suppress the power stage non-ideal effects, which are mainly induced by finite on-resistance, dead time, rise/fall time mismatch, jitter and supply noise. The ratio between the input resistor 11 and the feedback resistor 12 set a closed-loop gain of the Class-D amplifier. The loop filter 13 is configured to generate a processed signal according to the input signal and feedback signal, wherein the input signal may be an audio signal. The PWM generator 14 generates PW M signals according to the processed signal. The boost converter 16 provides a constant supply voltage PVDD to supply the power stage 15 according to a power supply $V_{BAT}$. The power stage 15 generates an output signal according to the PWM signals and the supply voltage PVDD. Then, the output signal drives a LC filter 17 and the speaker load 18. The input resistor 11 and feedback resistor 12 may contribute thermal noise, which typically accounts for more than half of the total noise of a Class-D amplifier, limiting the SNR of a Class-D amplifier. The input resistor 11 may be replaced by resistive DACs (RDACs) or current-steering DACs (IDACs) to convert the digital-format input signal, but the RDAC or IDAC itself may also contribute noise. The power supply $V_{BAT}$ may be a phone battery or an automotive battery. Since the voltage of the phone battery $V_{BAT}$ is usually between 3V and 4.2V, while the voltage of car batteries is between 12V and 14.4V, in order to increase the maximum output power, the boost converter 16 is used to provide a higher-level voltage PVDD as the supply voltage for the power stage 15 and then delivers the power to the speaker load 18. However, the two-step power conversion from the power supply $V_{BAT}$ to the speaker load 18 through the boost converter 16 and the power stage 15 may degrade overall power efficiency. Also, audio patterns are more dynamic and typically have a high crest factor, which means that the power stage 15 is rarely required to deliver high power to the speaker load 18, squandering the boosted supply voltage PVDD. In addition, the boost converter 16 usually needs to be paired with a set of LC components and control circuits, which may increase the system cost and size. The output signal of the power stage 15 contains high-frequency components due to rapid switching, which can easily radiate or conduct EMI, endangering surrounding circuits and equipment. To alleviate the EMI issue, the output signal will be processed by the LC filter 17 and then drive the speaker load 18. Nevertheless, the LC filter 17 may also increase the system cost and bulk.

FIG. 2 is a schematic diagram of a full-bridge power stage of a Class-D amplifier according to the prior art. The power stage 15 (e.g., the power stage 15 in FIG. 1) may be the full-bridge power stage 15. The full-bridge power stage 15 includes transistors $M_1$, $M_2$, $M_3$ and $M_4$. Each of the transistors $M_1$, $M_2$, $M_3$ and $M_4$ may be an n-channel MOSFET. The boost converter 16 (e.g., the boost converter 16 in FIG. 1) provides a constant supply voltage PVDD to the full-bridge power stage. The PWM signals generated by a PWM generator (e.g., the PWM generator 14 in FIG. 1) are used to control the transistors $M_1$, $M_2$, $M_3$ and $M_4$. The drain of transistor $M_1$ is coupled to the supply voltage PVDD and its source is coupled to a switching node LXA. The drain of transistor $M_2$ is coupled to the supply voltage PVDD and its source is coupled to a switching node LXB. The drain of transistor $M_3$ is coupled to the switching node LXA and its source is coupled to the ground. The drain of transistor $M_4$ is coupled to the switching node LXB and its source is coupled to the ground. The switching nodes LXA and LXB are coupled to the LC filters 17 and the speaker load 18 for outputting the signal (e.g., the LC filter 17 and the speaker load 18 in FIG. 1).

FIG. 3 shows waveforms of the PWM signals generated by a PWM generator according to the prior art. In the PWM generator 14, the processed signals $V_{LF+}$ and $V_{LF-}$ are modulated with a triangular carrier signal $V_{TRI}$ to generate the PWM signals PWMA and PWMB, where the processed signals $V_{LF+}$ and $V_{LF-}$ are generated by the loop filter 13 (e.g., the loop filter 13 in FIG. 1). These PWM signals PWMA and PWMB can then be used to control the transistors $M_1$, $M_2$, $M_3$ and $M_4$ in the full-bridge power stage (e.g., the full-bridge power stage in FIG. 2). As shown in FIG. 3, the term "1" refers to logic high and the term "O" refers to logic low. The full bridge power stage of the Class-D amplifier according to the prior art operates in the following four states: 1) When PWMA=1 and PWMB=1, $M_1$ and $M_2$ turn ON, $M_3$ and $M_4$ turn OFF, and the load current flows through a free-wheeling path formed by the speaker load 18 and the supply voltage PVDD. 2) When PWMA=1 and PWMB=0, $M_1$ and $M_4$ turn ON, $M_2$ and $M_3$ turn OFF, and the supply voltage PVDD provides load current from the left to the right. 3) When PWMA=0 and PWMB=1, $M_2$ and $M_3$ turn ON, $M_1$ and $M_4$ turn OFF, and the supply voltage PVDD provides load current from the right to the left. 4) When PWMA=0 and PWMB=0, $M_3$ and $M_4$ turn ON, $M_1$ and $M_2$ turn OFF, and the load current flows through a free-wheeling path formed by the speaker load 18 and the ground. This four-state operation is known as BD double-sided modulation according to the prior art.

To achieve low THD, the prior arts employ the closed-loop class-D amplifiers with resistive feedback to improve the linearity. However, the thermal noise of the resistor will degrade the SNR. To increase the maximum output power of the Class-D amplifiers, the prior arts adopt an additional boost converter to increase the power supply voltage of the power stage, but the boost converter requires additional LC components which may increase the system cost and bulk. Furthermore, to keep compliance with EMI standards, an additional LC filter is used to tackle the EMI issue, but this may also increase the system cost and bulk. Thus, how to realize a Class-D amplifier with low THD, high SNR, high output power and low EMI simultaneously at an affordable cost is a problem to be solved.

SUMMARY OF THE INVENTION

Therefore, the main purpose of the present invention is to provide a low-EMI capacitively-coupled Class-D amplifier with voltage boosting to solve the abovementioned problem.

To achieve the above purpose, the present invention is a Class-D amplifier, comprising a capacitively-coupled amplifier, configured to receive an input signal and a feedback signal, comprising an input and a feedback capacitor, wherein the ratio between the input capacitor and the feedback capacitor set a closed-loop gain of the Class-D amplifier; and a preamplifier, configured to generate an error signal according to the input signal and the feedback signal; and a loop filter, coupled to the preamplifier, configured to generate a processed signal according to the error signal; a pulse-width modulation (PWM) generator, coupled to the loop filter, configured to generate a plurality of PWM signals and a control signal, wherein the PWM generator modulates the processed signal with a triangular carrier signal to generate the PWM signals, wherein the center point of the control signal aligns with the peak and valley of the triangular carrier signal; and a voltage boosting power stage, coupled to the PWM generator, configured to generate a boosted output signal according to the plurality of PWM signals, the control signal and a power supply, and to feedback the boosted output signal to the loop filter, and filters the high-frequency components in the boosted output signal, wherein the maximum voltage of the boosted output signal is greater than the voltage of the power supply, wherein the voltage boosting power stage comprises a first transistor, comprising a first drain, a first gate and a first source; a second transistor, comprising a second drain, a second gate and a second source; a third transistor, comprising a third drain, a third gate and a third source; a fourth transistor, comprising a fourth drain, a fourth gate and a fourth source; a fifth transistor, comprising a fifth drain, a fifth gate and a fifth source; a sixth transistor, comprising a sixth drain, a sixth gate and a sixth source; an inductor; a first capacitor; and a second capacitor; wherein the first drain and the second drain are coupled to the power supply; the first source, the third drain and the fifth source are coupled to a first switching node; the second source, the fourth drain and the sixth source are coupled to a second switching node; the fifth drain is coupled to a first output node; the sixth drain is coupled to a second output node; the third source and the fourth source are coupled to ground; the inductor is connected between the first switching node and the second switching node; the capacitor is connected between the first output node and the ground; and the capacitor is connected between the second output node and the ground.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 9 is present invention compare to the typical Class-D amplifiers.

DESCRIPTION OF THE PREFERRED EMBODIMENT

Figure 4:
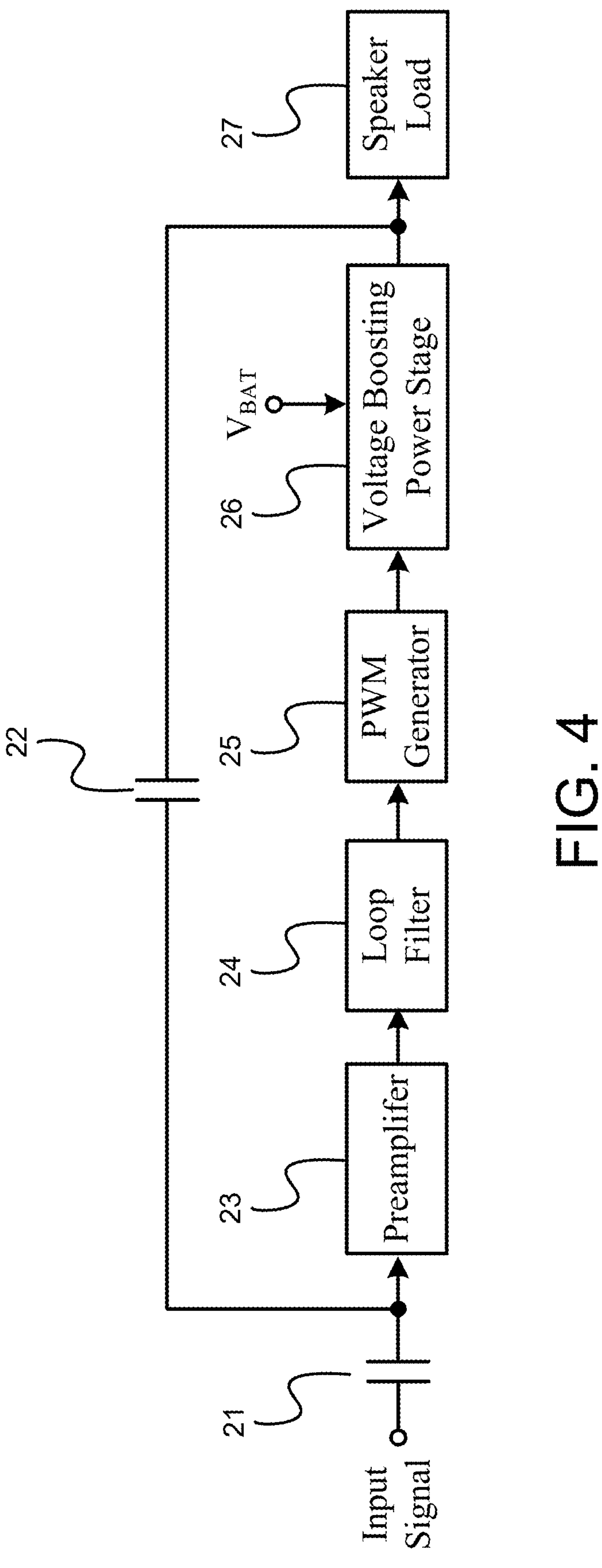
FIG. 4 is a block diagram of a closed-loop Class-D amplifier with capacitive feedback and voltage boosting power stage according to an example of the present invention.

FIG. 4 is a block diagram of a closed-loop Class-D amplifier with capacitive feedback and voltage boosting power stage according to an example of the present invention. The closed-loop Class-D amplifier with capacitive feedback and voltage boosting power stage includes an input capacitor 21, a feedback capacitor 22, a preamplifier 23, a loop filter 24, a PWM generator 25, a voltage boosting power stage 26 and a speaker load 27. The input capacitor 21, the feedback capacitor 22 and the preamplifier 23 together constitute a capacitively-coupled amplifier. The ratio between the input capacitor 21 and the feedback capacitor 22 set a closed-loop gain of the Class-D amplifier. The preamplifier 23 is configured to generate an error signal according to the input signal and feedback signal, wherein the input signal may be an audio signal. The loop filter 24 comprises at least one integrator or at least one resonator. The loop filter 24 is configured to generate a processed signal according to the error signal. The PWM generator 25 generates PWM signals and a control signal according to the processed signal. The voltage boosting power stage 26 generates a boosted output signal according to the PWM signals the control signal and the power supply and $V_{BAT}$, and filters the high-frequency components in the boosted output signal, wherein the boosted output signal may be greater than the power supply $V_{BAT}$. Then, the boosted output signal drives the speaker load 27. The power supply $V_{BAT}$ may be a phone battery or an automotive battery. The voltage boosting power stage 26 requires additional transistors and LC components to implement the boost function, and the LC components can also act as a low-pass LC filter, thereby reducing EMI. Moreover, the one-step power conversion from the power supply $V_{BAT}$ to the speaker load 27 through the voltage boosting power stage 26 will be more power efficient compare to the prior art. The input capacitor 21 and feedback capacitor 22 don't contribute thermal noise, achieving high SNR. However, due to the rapid switching activities, the high-frequency components in the boosted output signal may directly couple through the feedback capacitor 22 to the input stage amplifier in the loop filter 24, causing slewing and degrading the linearity of the Class-D amplifier. Nevertheless, by virtue of LC filtering in voltage boosting power stage 26, the high-frequency components in boosted output signal can be suppressed.

Figure 1:
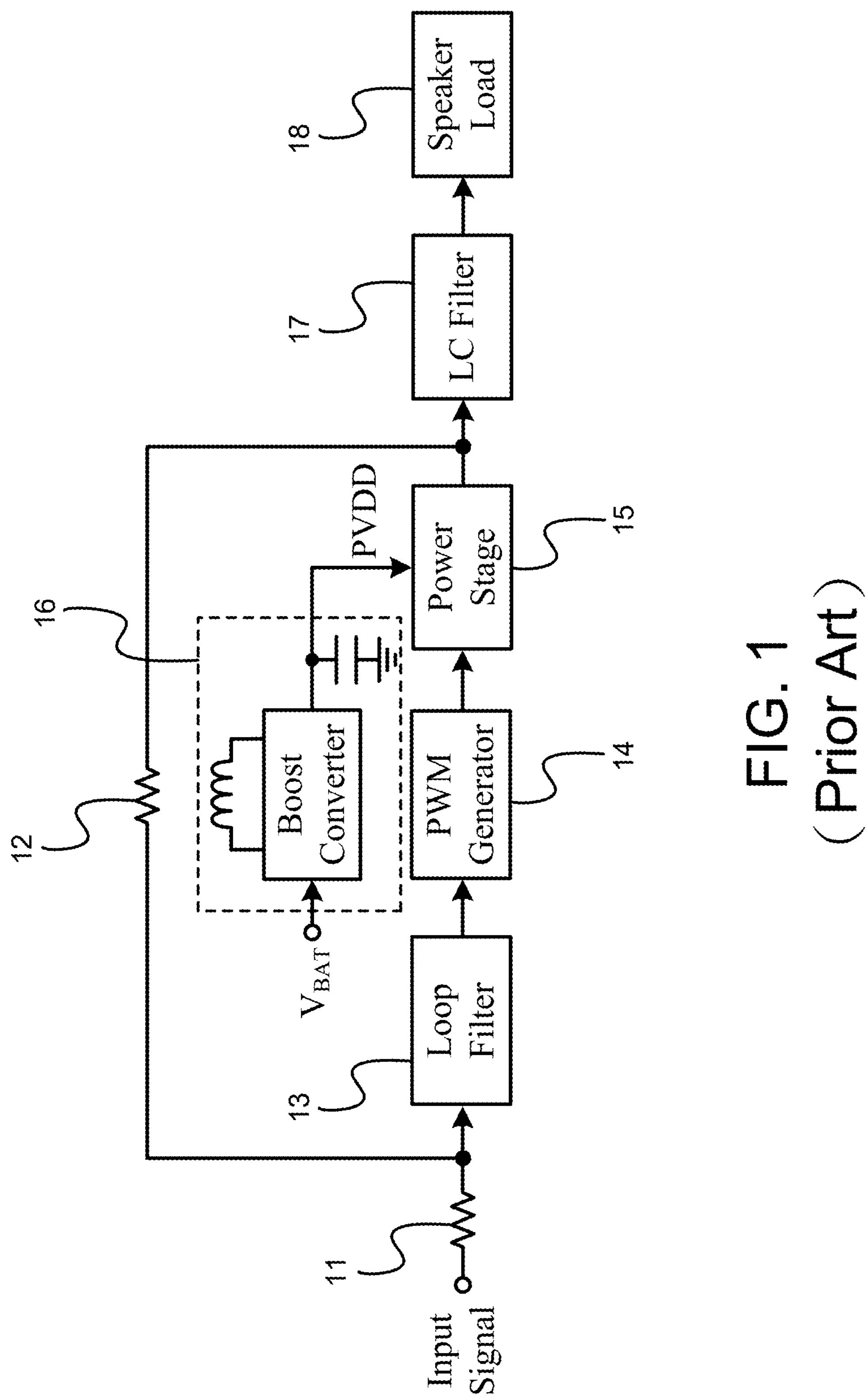
FIG. 1 (prior art) is a block diagram of a closed-loop Class-D amplifier with resistive feedback according to the prior art.
Figure 2:
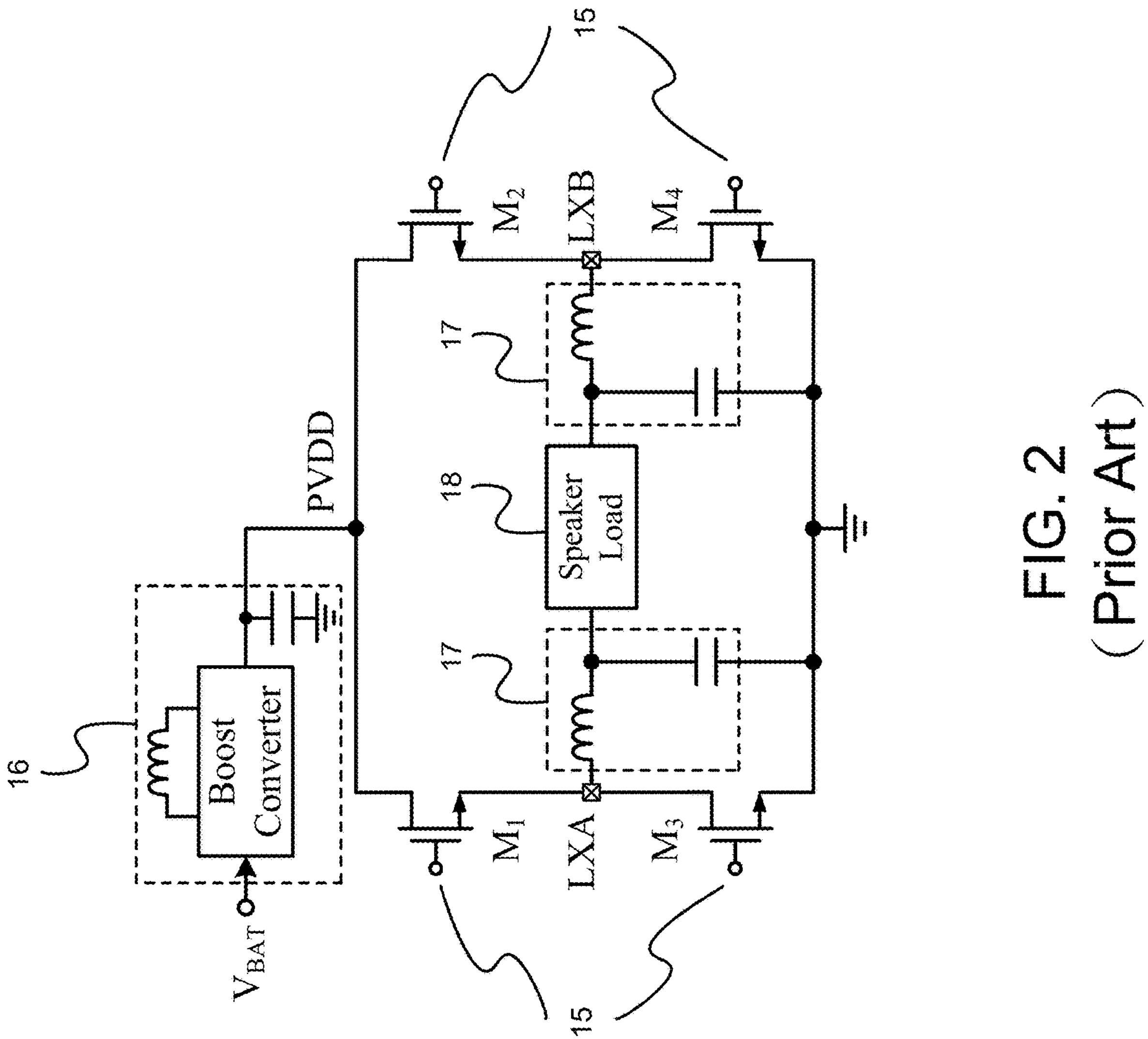
FIG. 2 (prior art) is a schematic diagram of a full-bridge power stage of a Class-D amplifier according to the prior art.
Figure 5:
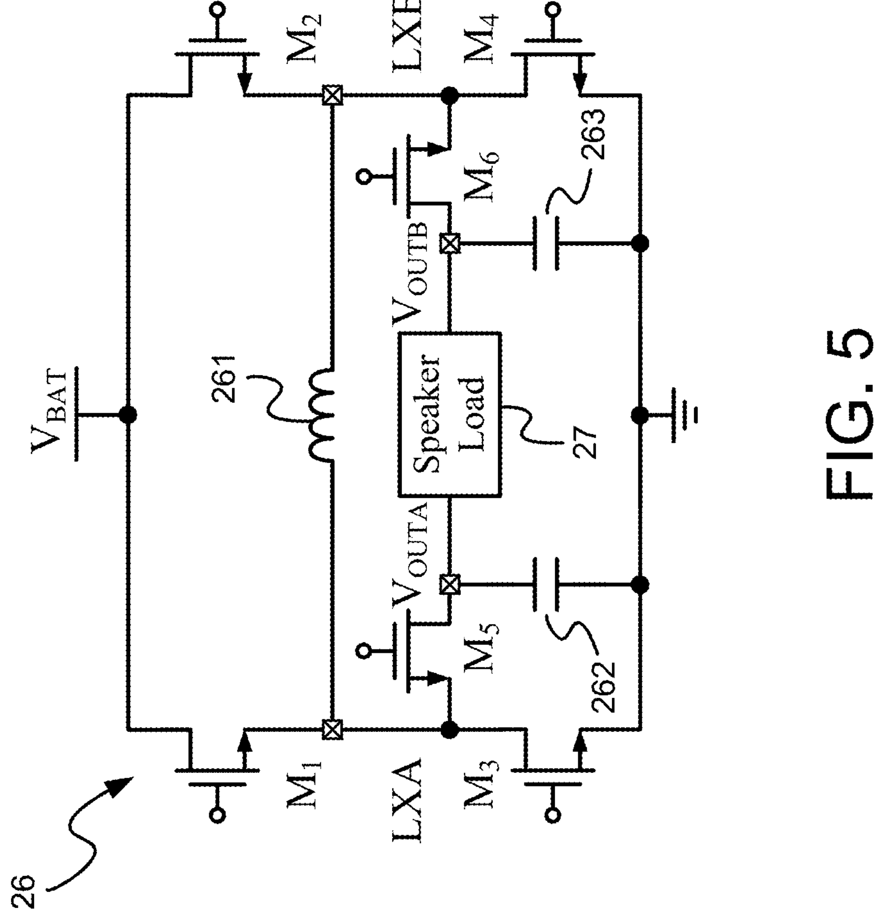
FIG. 5 is a schematic diagram of a full-bridge voltage boosting power stage of a Class-D amplifier according to an example of the present invention.

FIG. 5 is a schematic diagram of a full-bridge voltage boosting power stage of a Class-D amplifier according to an example of the present invention. The voltage boosting power stage 26 (e.g., the voltage boosting power stage in FIG. 4) may be the full-bridge voltage boosting power stage 26. The full-bridge voltage boosting power stage 26 includes transistors $M_1$, $M_2$, $M_3$, $M_4$, $M_5$ and $M_6$, an inductor 261 and two capacitors 262, 263. Each of the transistors $M_1$, $M_2$, $M_3$, $M_4$, $M_5$ and $M_6$ may be an n-channel MOSFET. The power supply $V_{BAT}$ directly supplies the full-bridge voltage boosting power stage 26. The PWM signals and a control signal generated by a PWM generator (e.g., the PWM generator 25 in FIG. 4) are used to control the on/off of the transistors $M_1$, $M_2$, $M_3$, $M_4$, $M_5$ and $M_6$, and providing the power to the inductor through the power supply or providing the power to a load through the inductor. The transistors $M_1$, $M_2$, $M_3$, $M_4$, $M_5$ and Me each comprise a drain, a gate and a source. The drain of transistor $M_1$ is coupled to the power supply $V_{BAT}$ and its source is coupled to a switching node LXA. The drain of transistor $M_2$ is coupled to the power supply $V_{BAT}$ and its source is coupled to a switching node LXB. The drain of transistor $M_3$ is coupled to the switching node LXA and its source is coupled to the ground. The drain of transistor $M_4$ is coupled to the switching node LXB and its source is coupled to the ground. The drain of transistor $M_5$ is coupled to an output node $V_{OUTA}$ and its source is coupled to the node LXA. The drain of transistor $M_6$ is coupled to an output node $V_{OUTB}$ and its source is coupled to the node LXB. An inductor 261 is connected between the switching node LXA and the switching node LXB. A capacitor 262 is connected between the output node $V_{OUTA}$ and the ground. A capacitor 263 is connected between the output node $V_{OUTB}$ and the ground. The output nodes $V_{OUTA}$ and $V_{OUTB}$ are coupled to the speaker load 27 for outputting the boosted signal (e.g., the speaker load 27 in FIG. 4). Compared to the full bridge power stage of a Class-D amplifier according to the prior art as shown in FIG. 2, the present invention only needs two additional transistors, one inductor 261 and two capacitors 262, 263 to boost the output signal while filtering the high-frequency components caused by the rapid switching activities. Thus, it can achieve high output power and low EMI at low cost.

Figure 6:
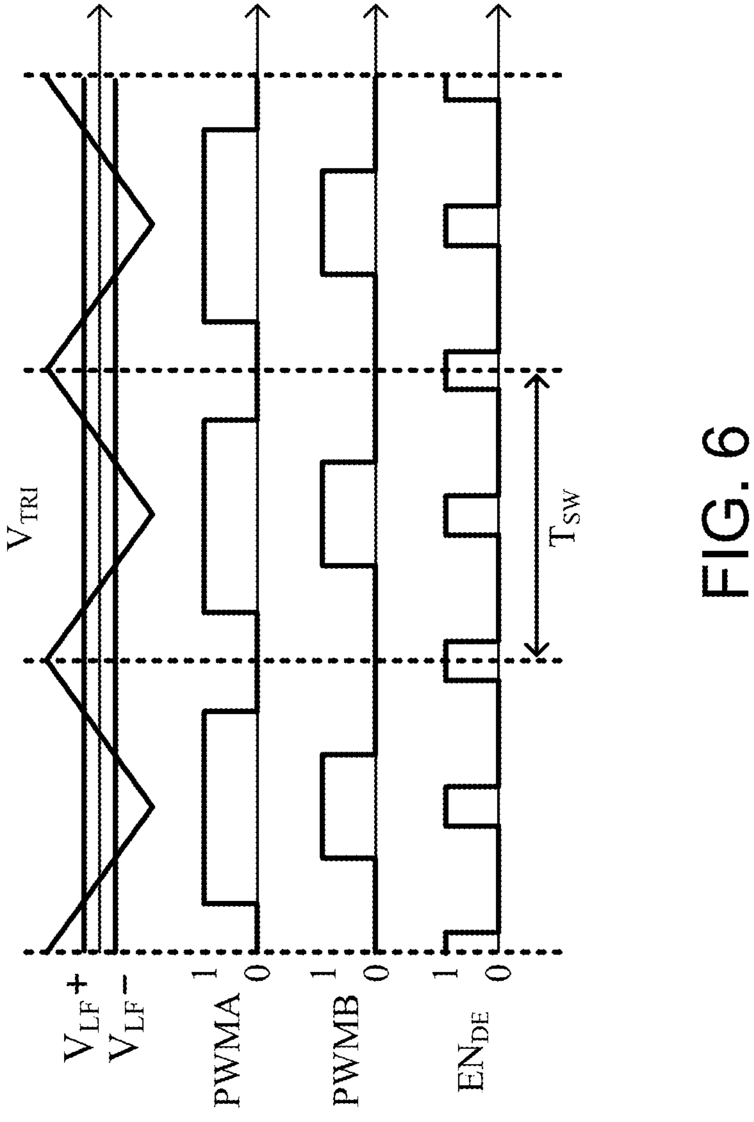
FIG. 6 shows waveforms of the PWM signals and the control signal generated by a PWM generator according to an example of the present invention.

FIG. 6 shows waveforms of the PWM signals and the control signal $EN_{DE}$ generated by a PWM generator according to an example of the present invention. In the PWM generator, the processed signals $V_{LF+}$ and $V_{LF-}$ are modulated with a triangular carrier signal $V_{TRI}$ to generate the PWM signals PWMA and PWMB, as well as the control signal $EN_{DE}$, wherein the processed signals $V_{LF+}$ and $V_{LF-}$ are generated by the loop filter (e.g., the loop filter 24 in FIG. 4). These PWM signals PWMA and PWMB and the control signal $EN_{DE}$ can then be used to control the transistors $M_1$, $M_2$, $M_3$, $M_4$, $M_5$ and $M_6$ in the full-bridge voltage boosting power stage (e.g., the full-bridge voltage boosting power stage 26 in FIG. 5). As shown in FIG. 6, the term "1" refers to logic high and the term "0" refers to logic low. The full bridge voltage boosting power stage of the Class-D amplifier according to an example of the present invention operates in the following five phases: 1) When PWMA=1, PWMB=1 and $EN_{DE}$=0, $M_1$ and $M_2$ turn ON, $M_3$, $M_4$, $M_5$ and $M_6$ turn OFF, the inductor current flows through a free-wheeling path formed by the inductor and the power supply $V_{BAT}$. 2) When PWMA=1, PWMB=0 and $EN_{DE}$=0, $M_1$ and $M_4$ turn ON, $M_2$, $M_3$, $M_5$ and $M_6$ turn OFF, the inductor is energized by the power supply $V_{BAT}$ and the inductor current flows from the left to the right. 3) When PWMA=0, PWMB=1, $EN_{DE}$=0, $M_2$ and $M_3$ turn ON, $M_1$, $M_4$, $M_5$ and $M_6$ turn OFF, the inductor is energized by the power supply $V_{BAT}$ and the inductor current flows from the right to the left. 4) When PWMA=0, PWMB=0, $EN_{DE}$=0, $M_3$ and $M_4$ turn ON, $M_1$, $M_2$, $M_5$ and $M_6$ turn OFF, and the inductor current flows through a free-wheeling path formed by the inductor and the ground. 5) When $EN_{DE}$=1, $M_5$ and $M_6$ turn ON, $M_1$, $M_2$, $M_5$ and Me turn OFF, the inductor is de-energized to the speaker load and the capacitors. This five-state operation is called voltage-boosting BD (VBBD) double-sided modulation according to an example of the present invention.

Figure 3:
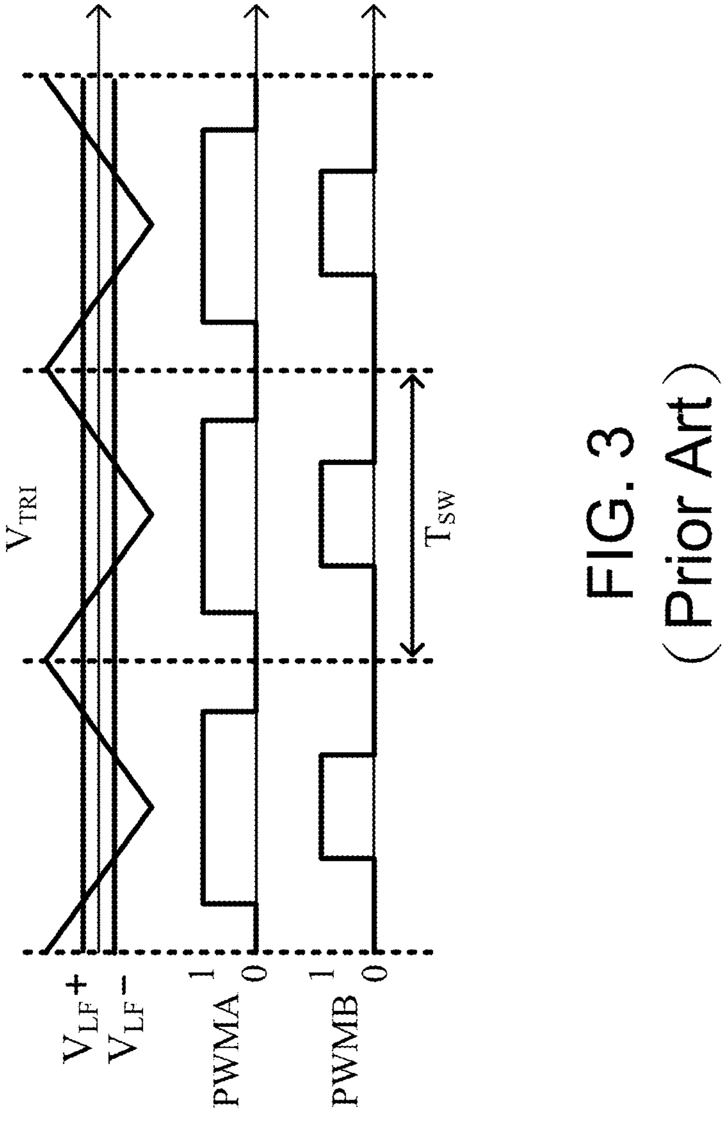
FIG. 3 (prior art) shows waveforms of the PWM signals generated by a PWM generator according to the prior art.

In the BD double-side modulation according to the prior art, the power is delivered to the speaker load directly through the supply voltage PVDD (i.e., PWMA=0, PWMB=1 or PWMA=1, PWMB=0 in FIG. 3); however, in the VBBD double-side modulation according to an example of the present invention, the power is first delivered to the inductor through the power supply $V_{BAT}$ (i. e., PWMA=0, PWMB=1, $EN_{DE}$=0 or PWMA=1, PWMB=0, $EN_{DE}$=0 in FIG. 6), and then an additional state for power delivering to the speaker load through the inductor (i.e., $EN_{DE}$=1 in FIG. 6). Based on the principle of voltage-second balance on the inductor, the voltage of the boosted output signal is determined by the duty cycle of the power delivery from the power supply $V_{BAT}$ to the inductor and the duty cycle of the power delivery from the inductor to the speaker load, wherein the voltage of the boosted output signal is greater than the voltage of power supply within the duty cycle of providing the power to the inductor through the power supply greater than the duty cycle of providing the power to the load through the inductor; alternatively, the voltage of the boosted output signal is less than the voltage of power supply within the duty cycle of providing the power to the inductor through the power supply less than the duty cycle of providing the power to the load through the inductor. In addition, due to the double-sided modulation, the effective switching frequency of the Class-D amplifier is doubled, thus reducing the ripple current on the inductor by half to lower ripple current loss. Also, the center point of the control signal $EN_{DE}$ is designed to align with the peak and valley of the triangular carrier signal $V_{TRI}$, so there are no transistors switch at the peak and valley of the triangular carrier signal $V_{TRI}$, and the chopping technique can also be adopted to chop the PWM signals PMWA and PWMB at the peak and valley of the triangular carrier signal $V_{TRI}$ without any sampling of PWM transients.

Figure 7:
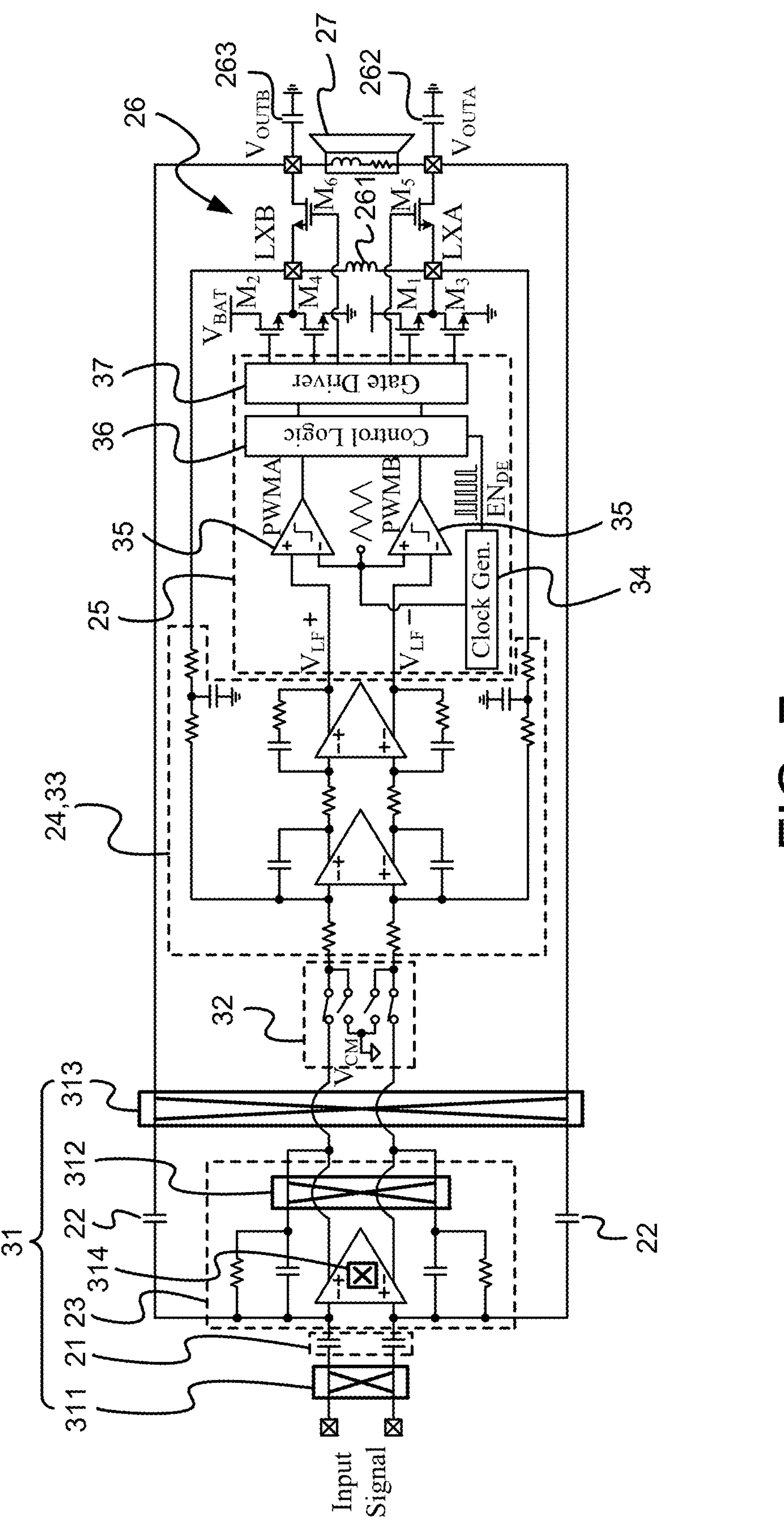
FIG. 7 is a detailed circuit diagram of a closed-loop analog-input Class-D amplifier with capacitive feedback and voltage boosting power stage in FIG. 4 according to an example of the present invention.

FIG. 7 is a detailed circuit diagram of a closed-loop analog-input Class-D amplifier with capacitive feedback and voltage boosting power stage in FIG. 4 according to an example of the present invention. The closed-loop analog-input Class-D amplifier with capacitive feedback and voltage boosting power stage includes a capacitively-coupled chopper amplifier 31, sampling-and-reset switches 32, second-order active-RC integrators 33, a clock generator 34, two comparators 35, a control logic 36, a gate driver 37, a voltage boosting power stage 26 and a speaker load 27. The capacitively-coupled chopper amplifier 31 consists of input capacitors 21, feedback capacitors 22, choppers 311, 312, 313, 314 and a preamplifier 23 (e.g., the preamplifier 23 in FIG. 4). The loop filter 24 (e.g., the loop filter 24 in FIG. 4) may include the second-order active-RC integrators 33. The PWM generator 25 (e.g., the PWM generator 25 in FIG. 4) may include the clock generator 34, two comparators 35, the control logic 36 and the gate driver 37. The ratio between the input capacitor 21 and the feedback capacitor 22 set a closed-loop gain of the Class D amplifier. The input chopper 311 and the feedback chopper 313 are inserted in the input path and feedback path, respectively, to mitigate the mismatch effect of the input capacitor 21 and the feedback capacitor 22, increasing the power supply rejection ratio (PSRR) of the closed-loop Class-D amplifier, wherein the chopper 311, 313 may be optional in some applications. The preamplifier 23 acts as a gain stage to suppress the noise contribution of the second-order active-RC integrators 33, and the preamplifier 23 also further includes choppers 312, 314 to mitigate the amplifier's flicker noise, wherein the choppers 312, 314 in preamplifier may be optional in some applications. The sampling-and-reset switches 32 are reset to the $V_{CM}$ during the chopping transitions to block the chopping glitches; otherwise, they are both connected to the output of the preamplifier 23, wherein the sampling-and-reset switches 32 may be optional in some applications. The second-order active-RC integrators 33 suppress the power stage non-ideal effects to achieve low THD. The clock generator 34 generates the triangular carrier signal and the control signal $EN_{DE}$, wherein the center point of the control signal $EN_{DE}$ is designed to align with the peak and valley of the triangular carrier signal $V_{TRI}$. In addition, the chopping transitions can be aligned with the peak and valley of $V_{TRI}$ to avoid sampling the signal-dependent transitions in $V_{OUTA}$ and $V_{OUTB}$ due to transistors switching in the power stage. The comparators 35 modulate the processed signals $V_{LF+}$, $V_{LF-}$ with the triangular carrier signal $V_{TRI}$ to generate the PWM signals PMWA and PWMB. The control logic 36 and the gate driver 37 control the operation of the voltage boosting power stage 26. The voltage boosting power stage 26 comprises six transistors ($M_1$, $M_2$, $M_3$, $M_4$, $M_5$ and $M_6$), one inductor 261, and two capacitors 262, 263, generating the boosted output signal to drive the speaker load 27, wherein the high-frequency components in boosted output signal can be suppressed by LC filtering, thus reducing EMI.

Figure 8:
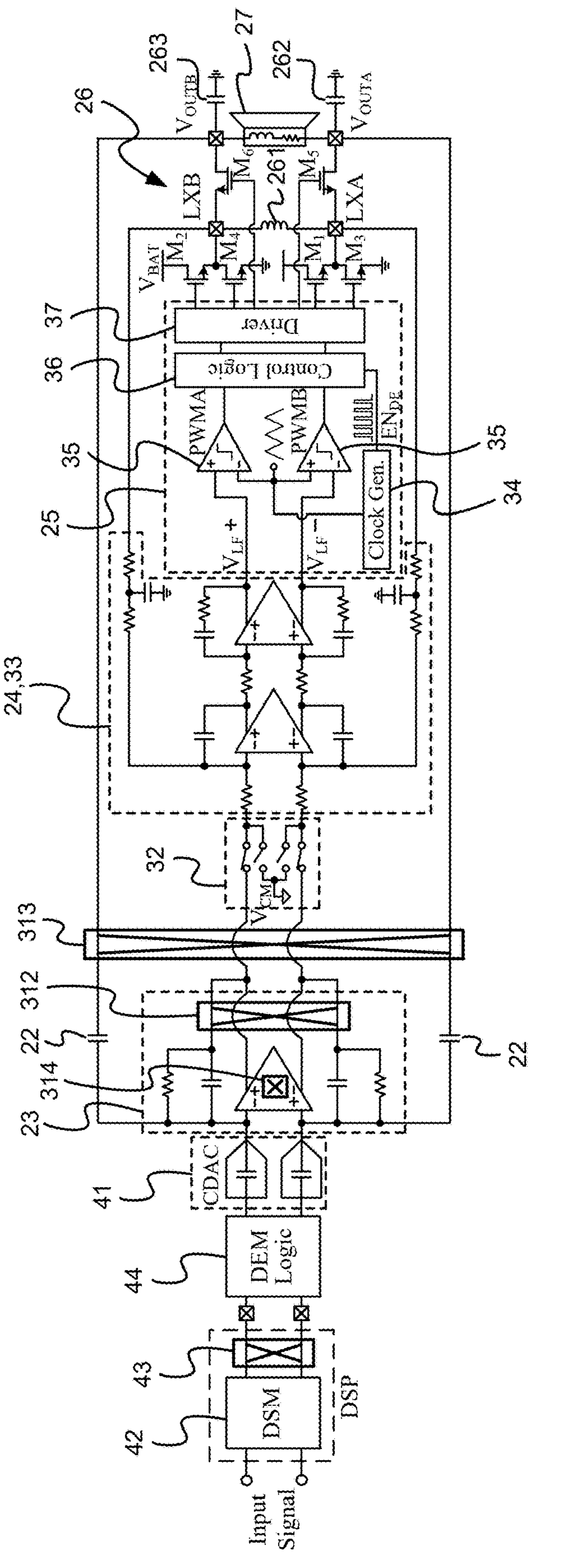
FIG. 8 is a detailed circuit diagram of a closed-loop digital-input Class-D amplifier with capacitive feedback and voltage boosting power stage in FIG. 4 according to an example of the present invention.

FIG. 8 is a detailed circuit diagram of a closed-loop digital-input Class-D amplifier with capacitive feedback and voltage boosting power stage in FIG. 4 according to an example of the present invention. Compare to the example of FIG. 7, the input capacitor 21 is replaced b y capacitive digital-to-analog converter (CDAC) 41. The input signal may be a digital-format audio signal. A delta-sigma modulator (DSM) 42 is used to truncate the bit number of input signal while maintaining signal quality, and then chopped by the choppers 43, wherein DSM 42 and choppers 43 are implemented on digital signal processing (DSP). A dynamic element matching (DEM) logic 44 drives the CDAC 41 according to the chopped digital signal to deal with the mismatch error of CDAC. The descriptions of rest of the circuits are similar to the example of FIG. 7.

In the present invention provides a low-EMI capacitively-coupled Class-D amplifiers with voltage boosting. Low THD is achieved by the closed-loop architecture with capacitive feedback, and the high SNR is also achieved thanks to no thermal noise contribution of the capacitor. The voltage boosting power stage generates the boosted output signal with LC filtering, thereby increasing the maximum output power and reducing EMI. Moreover, compare to the typical Class-D amplifiers shown in FIG. 9, the present invention neither needs to boost LC components of a converter nor needs an LC filter but only requires one inductor and two capacitors, which greatly reduce the system cost and bulk.

Furthermore, according to the present invention, power supply $V_{BAT}$ directly supplies power to the voltage boosting power stage such that one-step power conversion from power supply $V_{BAT}$ to a speaker load saves more power than the prior art (as shown in FIG. 2, two-step power conversion from power supply $V_{BAT}$ to a speaker load through a boost converter and a power stage reduces overall power efficiency.) To sum up, the present invention achieves low THD, high SNR, high output power and low EMI simultaneously.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Class-D amplifier, comprising:

a capacitively-coupled amplifier, configured to receive an input signal and a feedback signal, comprising:

an input and a feedback capacitor, wherein the ratio between the input capacitor and the feedback capacitor set a closed-loop gain of the Class-D amplifier; and a preamplifier, configured to generate an error signal according to the input signal and the feedback signal; and a loop filter, coupled to the preamplifier, configured to generate a processed signal according to the error signal;

a pulse-width modulation (PWM) generator, coupled to the loop filter, configured to generate a plurality of PWM signals and a control signal, wherein the PWM generator modulates the processed signal with a triangular carrier signal to generate the PWM signals, wherein the center point of the control signal aligns with the peak and valley of the triangular carrier signal; and a voltage boosting power stage, coupled to the PWM generator, configured to generate a boosted output signal according to the plurality of PWM signals, the control signal and a power supply, and to feedback the boosted output signal to the loop filter, and filters the high-frequency components in the boosted output signal, wherein the maximum voltage of the boosted output signal is greater than the voltage of the power supply, wherein the voltage boosting power stage comprises:

a first transistor, comprising a first drain, a first gate and a first source;

a second transistor, comprising a second drain, a second gate and a second source;

a third transistor, comprising a third drain, a third gate and a third source;

a fourth transistor, comprising a fourth drain, a fourth gate and a fourth source;

a fifth transistor, comprising a fifth drain, a fifth gate and a fifth source;

a sixth transistor, comprising a sixth drain, a sixth gate and a sixth source;

an inductor;

a first capacitor; and a second capacitor;

wherein the first drain and the second drain are coupled to the power supply; the first source, the third drain and the fifth source are coupled to a first switching node; the second source, the fourth drain and the sixth source are coupled to a second switching node; the fifth drain is coupled to a first output node; the sixth drain is coupled to a second output node; the third source and the fourth source are coupled to ground; the inductor is connected between the first switching node and the second switching node; the capacitor is connected between the first output node and the ground; and the capacitor is connected between the second output node and the ground.

2. The Class-D amplifier of claim 1, wherein the PWM signals and the control signal are configured to control the on/off of the transistors, and providing the power to the inductor through the power supply or providing the power to a load through the inductor.

3. The Class-D amplifier of claim 2, wherein the voltage of the boosted output signal is determined by the duty cycle of providing the power to the inductor through the power supply and the duty cycle of providing the power to the load through the inductor.

4. The Class-D amplifier of claim 3, wherein the voltage of the boosted output signal is greater than the voltage of power supply within the duty cycle of providing the power to the inductor through the power supply greater than the duty cycle of providing the power to the load through the inductor.

5. The Class-D amplifier of claim 3, wherein the voltage of the boosted output signal is less than the voltage of power supply within the duty cycle of providing the power to the inductor through the power supply less than the duty cycle of providing the power to the load through the inductor.

6. The Class-D amplifier of claim 1, wherein the loop filter comprises at least one input stage amplifier for receiving the input signal and the feedback signal.

7. The Class-D amplifier of claim 1, wherein the loop filter comprises at least one integrator or at least one resonator.

8. The Class-D amplifier of claim 1, wherein the input capacitor comprises at least one capacitive digital-to-analog converter (CDAC).

9. The Class-D amplifier of claim 8, further comprising a delta-sigma modulator (DSM), choppers and a dynamic element matching (DEM) logic, wherein the DSM is used to truncate the bit number of input signal, and then chopped by the choppers, and the DEM logic drives the CDAC according to the chopped digital signal to deal with the mismatch error of CDAC.

10. The Class-D amplifier of claim 9, wherein DSM and choppers are implemented on digital signal processing (DSP).

11. The Class-D amplifier of claim 1, wherein the six transistors comprise n-channel MOSFETs.

12. The Class-D amplifier of claim 1, wherein the PWM generator includes the clock generator, two comparators, the control logic and the gate driver.

13. The Class-D amplifier of claim 1, wherein the capacitively-coupled amplifier further includes multiple choppers, including an input chopper and the feedback chopper inserted in the input path and feedback path, respectively, and including choppers in the preamplifier.

14. The Class-D amplifier of claim 1, further including sampling-and-reset switches connected to the output of the preamplifier.

* * * * *